(12) United States Patent
Benson et al.

(10) Patent No.: US 10,615,098 B2
(45) Date of Patent: Apr. 7, 2020

(54) DIELECTRIC HEAT PATH DEVICES, AND SYSTEMS AND METHODS USING THE SAME

(71) Applicant: EATON CORPORATION, Cleveland, OH (US)

(72) Inventors: Tony Ray Benson, Monticello, IL (US); Peter J. Fritz, Williamston, MI (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 15/874,032

(22) Filed: Jan. 18, 2018

(65) Prior Publication Data

US 2018/0145008 A1 May 24, 2018

Related U.S. Application Data

(62) Division of application No. 15/078,481, filed on Mar. 23, 2016.

(51) Int. Cl.
| | |
|---|---|
| *H01L 23/40* | (2006.01) |
| *H01L 21/48* | (2006.01) |
| *H01L 23/373* | (2006.01) |
| *H01L 23/36* | (2006.01) |

(52) U.S. Cl.
CPC ...... *H01L 23/4006* (2013.01); *H01L 21/4882* (2013.01); *H01L 23/36* (2013.01); *H01L 23/3731* (2013.01); *H01L 2023/4056* (2013.01); *H01L 2023/4068* (2013.01)

(58) Field of Classification Search
None
See application file for complete search history.

(56) References Cited

U.S. PATENT DOCUMENTS

| | | |
|---|---|---|
| 4,100,089 A | 7/1978 | Cammack, II et al. |
| 4,733,329 A | 3/1988 | Barner et al. |
| 5,196,815 A | 3/1993 | Chien et al. |
| 5,315,477 A | 5/1994 | Schumacher et al. |
| 5,315,830 A | 5/1994 | Doke et al. |
| 7,626,202 B2 | 12/2009 | Yamazaki |
| 7,696,517 B2 | 4/2010 | Luan et al. |
| 7,821,050 B1 | 10/2010 | Liu et al. |
| 7,859,063 B2 | 12/2010 | Hayashi |
| 8,178,926 B2 | 5/2012 | Nakayama |
| 8,270,167 B2 | 9/2012 | Greenwood et al. |
| 8,373,195 B2 | 2/2013 | Yen |

(Continued)

FOREIGN PATENT DOCUMENTS

| | | |
|---|---|---|
| CN | 201879083 | 6/2011 |
| JP | 05161511 A | 6/1993 |

*Primary Examiner* — Telly D Green
(74) *Attorney, Agent, or Firm* — Eckert Seamans Cherin & Mellott, LLC

(57) ABSTRACT

Devices, systems, and methods for dissipating heat generated from an electrical current carrying device are provided herein. The disclosed concept provides a dielectric heat path device that assists in heat dissipation of an electrical current carrying device by transferring heat from one end of the device to another. The disclosed concept also provides systems that communicate heat generated by an electrical device to a thermally grounded secondary device through a dielectric heat path device to dissipate heat.

6 Claims, 8 Drawing Sheets

(56) References Cited

U.S. PATENT DOCUMENTS

| | | |
|---|---|---|
| 8,673,711 B2 | 3/2014 | Kim et al. |
| 8,674,509 B2 | 3/2014 | Carpenter et al. |
| 8,916,966 B2 | 12/2014 | Mays |
| 9,214,405 B2 | 12/2015 | Tsukamoto |
| 2001/0015509 A1 | 8/2001 | Tiegs et al. |
| 2006/0072296 A1 | 4/2006 | Mays |
| 2009/0068441 A1 | 3/2009 | Swaroop et al. |
| 2010/0304078 A1 | 12/2010 | Stol et al. |
| 2011/0222239 A1 | 9/2011 | Dede |
| 2012/0113569 A1 | 5/2012 | Peralta et al. |
| 2012/0139075 A1 | 6/2012 | Shankar et al. |
| 2012/0139076 A1 | 6/2012 | Shankar et al. |
| 2012/0255719 A1 | 10/2012 | Hsueh |
| 2012/0281335 A1 | 11/2012 | Engel et al. |
| 2013/0307025 A1* | 11/2013 | Pal .................. H01L 29/7831 257/192 |
| 2014/0151687 A1 | 6/2014 | Yamazaki |
| 2014/0166071 A1 | 6/2014 | Gaynes et al. |
| 2014/0210072 A1 | 7/2014 | Tsukamoto |
| 2015/0001623 A1* | 1/2015 | Wang .............. H01L 29/78654 257/347 |
| 2015/0232732 A1 | 8/2015 | DiBattista et al. |
| 2015/0236113 A1* | 8/2015 | Song .............. H01L 21/28123 257/411 |
| 2015/0349513 A1 | 12/2015 | Kim |

\* cited by examiner

DIELECTRIC HEAT PATH DEVICES, AND SYSTEMS AND METHODS USING THE SAME

CROSS-REFERENCE TO RELATED APPLICATIONS

This application is a divisional of U.S. patent application Ser. No. 15/078,481, filed Mar. 23, 2016, the contents of which are incorporated in their entirety herein by reference.

This application is related to commonly assigned, concurrently filed U.S. patent application Ser. No. 15/078,473, filed Mar. 23, 2016, and entitled "LOAD CENTER THERMALLY CONDUCTIVE COMPONENT".

BACKGROUND

Field

The disclosed concept generally relates to systems and, more particularly, to systems including a number of electrical current carrying devices. The disclosed concept also relates to dielectric heat path devices for dissipating undesired heat generated by electrical current carrying devices. The disclosed concept further relates to methods for manufacturing dielectric heat path devices.

Background Information

Heat generated by electrical current carrying devices presents significant problems. For example, excess heat can cause electrical devices to malfunction or permanently break down. Generally, when excess heat issues arise, the various malfunctioning components of the electrical device will need to be repaired and/or replaced. Excess heat may also lead to electrical fires, causing further damage to the electrical device and/or property surrounding the electrical device.

One way to minimize adverse effects due to heat is to build electrical devices using materials that dissipate heat well. However, these materials are typically expensive, and therefore limit the service capacity of the electrical device and the corresponding sales volume of the electrical devices. Another way to minimize adverse effects due to heat is to build the electrical device such that it is in thermal communication with one or more heat sinks. A heat sink generally corresponds to thermal-conductive passive structures and/or active devices (e.g., fans), that are designed to transfer undesired heat, and preferably reduce operational temperatures.

Heat sinks that are formed of conductive materials (e.g. copper) are capable of conducting both heat and electricity. If these heat sinks are grounded, however, the electrical conductivity of the heat sink runs the risk of shorting or grounding the entire electrical device that is coupled to the heat sink. Short circuits are dangerous and undesirable for operation of electrical devices with an electrically conductive and grounded heat sink. Furthermore, fans, such as those to increase air flow about the heat sink, require extra electricity to operate. This causes additional strain, both financial, safety, and in terms of energy consumption, on the electrical device itself.

There is, therefore, room for improvement in heat path devices for dissipating undesired heat from electrical current carrying device, and in systems for using and methods for making heat path devices.

SUMMARY

These needs and others are met by embodiments of the disclosed concept, which are directed to dielectric heat path devices and associated systems and methods that, among other benefits, allow heat to transfer from an electrical current carrying device to a grounded device, or device of alternative voltage.

As one aspect of the disclosed concept, a heat path device is provided. The device includes a first structure, a second structure, and a third structure. The first structure includes a first end and a second end. The second structure also includes a first end and a second end. Both the first structure and the second structure are made from thermally conductive materials. The third structure includes a first end and a second. The third structure is made of a dielectric material. The first end of the third structure is mechanically coupled and thermally coupled to the first end of the first structure. The second end of the third structure is mechanically coupled and thermally coupled to the first end of the second structure.

As another aspect of the disclosed concept, a system is provided. The system has an electrical device that generates heat. The system also has a secondary device. The system also has a heat path device for assisting in heat transfer and dissipation. The device includes a first structure, a second structure, and a third structure. The first structure includes a first end and a second end. The first end of the first structure is thermally coupled to the electrical device. The second structure also includes a first end and a second end. The first end of the second structure is thermally coupled to the secondary device. Both the first structure and the second structure are made from thermally conductive materials. The third structure includes a first end and a second. The third structure is made of a dielectric material. The first end of the third structure is mechanically coupled and thermally coupled to the first end of the first structure. The second end of the third structure is mechanically coupled and thermally coupled to the first end of the second structure.

As yet another aspect of the disclosed concept, a method for assembling a heat path device is provided. First, a first structure having a first end and a second end is provided. The first structure is formed of a thermally conductive material. Next, a second structure having a first end and a second end is provided. The second structure is formed of a thermally conductive material. Next, a third structure having a first end and a second end is provided. The third structure is formed of a dielectric material. The first end of the third structure is then attached to the first end of the first structure. Lastly, the second end of the third structure is attached to the first end of the second structure.

BRIEF DESCRIPTION OF DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
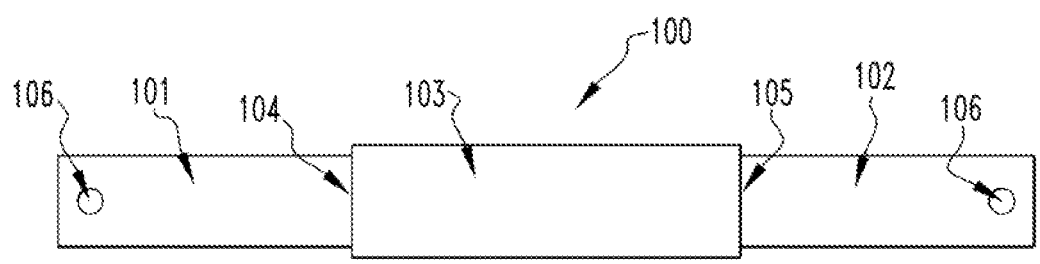
FIG. 1 is an illustrative schematic diagram of a dielectric heat path device in accordance with an embodiment of the disclosed concept.

The disclosed concept may take form in various components and arrangements of components, and in various techniques, methods, or procedures and arrangements of steps. The referenced drawings are only for the purpose of illustrated embodiments, and are not to be construed as limiting the disclosed concept. Various inventive features are described below that can each be used independently of one another or in combination with other features.

Directional phrases used herein, such as, for example, left, right, front, back, top, bottom and derivatives thereof, relate to the orientation of the elements shown in the drawings and are not limiting upon the claims unless expressly recited therein.

As employed herein, the singular form of "a", "an", and "the" include plural references unless the context clearly dictates otherwise. Still further, as used herein, the term "number" shall mean one or an integer greater than one (e.g., a plurality).

As employed herein, the term "number" shall mean one or an integer greater than one (i.e., a plurality).

As employed herein, the term "connected" or "coupled" shall mean that two or more parts are joined together directly or joined through one or more intermediate parts. Furthermore, the term "attach" or "attached", as employed herein, shall mean that two or more parts are joined together directly or through one or more intermediate parts.

Further still, as employed herein, the term "thermally coupled" or "thermally connected" or "thermally attached" shall mean that two or more parts are joined together directly or through one or more intermediate parts such that heat may flow between the two or more parts. Additionally, as employed herein, the term "electrically coupled" or "electrically connected" shall mean that two or more parts are joined together, directly or through one or more intermediate parts such that electricity may flow between the two or more parts.

As employed herein, the statement that two or more parts or components are "electrically coupled" or are in "electrical communication" shall mean that the two or more parts or components are joined together either directly or joined through one or more intermediate parts such that electricity, current, voltage, and/or energy is operable to flow from one part or component to the other part or component, and vice versa.

FIG. 1 is an illustrative schematic diagram of a dielectric heat path device 100 in accordance with an embodiment of the disclosed concept. Dielectric heat path device 100 includes a first structure 101, a second structure 102 and a third structure 103. Device 100 is structured such that it conducts heat from first structure 101, and the heat is then communicated from first structure 101 to second structure 102 via third structure 103. Although only three structures are shown within device 100, persons of ordinary skill in the art will recognize that any number of structures may be used, and one or more additional structures or components may be added or omitted. Additionally, one or more structures may be combined or separated, and multiple instances of various components are also possible. However, for simplicity, only one of each structure is shown within device 100.

First structure 101, in one exemplary, non-limiting, embodiment, is substantially rectangular such that it includes a first end, a second end, a top side, and a bottom side. First structure 101, in the exemplary embodiment, is made of a thermally conductive material. Various types of thermally conductive materials include, but are not limited to, metals, alumina, aluminum, brass, bronze, copper, glass, gold, polyethylene, silver, steel, stainless steel, titanium, and/or zinc. In addition to being thermally conductive, the material that first structure 101 is made of, in one embodiment, is also electrically conductive. Furthermore, in an exemplary embodiment, first structure 101 includes a hole 106 located at the first end of first structure 101. Hole 106 is configured to couple first structure 101 to a heat source, such as an electrical device (not shown).

Second structure 102, in the exemplary, non-limiting, embodiment, is substantially rectangular in shape such that it includes a first end, a second end, a top side, and a bottom side. Second structure 102, in the exemplary embodiment, is also made of a thermally conductive material. In one embodiment, second structure 102 is made from a substantially similar material as that of first structure 101. Furthermore, second structure 102, in one embodiment, is also formed of a material that is electrically conductive. In the exemplary embodiment, second structure 102 also include an instance of hole 106 located at the second end of second structure 102 such that second structure 102 is configured to couple to a secondary device that assists in transferring and dissipating heat.

Third structure 103, in an exemplary, non-limiting, embodiment, is also substantially rectangular and includes a first end, a second end, a top side, and a bottom side. In the exemplary embodiment, third structure 103 is made of a dielectric material. Various types of dielectric materials include, but are not limited to, boron nitride, aluminum nitride, aluminum oxide ceramic, magnesium aluminum silicate, and magnesium silicate compounds.

In one embodiment, the first end of third structure 103 is mechanically coupled and thermally coupled at intersection 104 to the first end of first structure 101. The second end of third structure 103 is mechanically coupled and thermally coupled at intersection 105 to the first end of second structure 102. Mechanically coupling, as described herein, corresponds to any suitable mechanism that secures two or more structures together, such as first structure 101 and third structure 102, and/or second structure 102 and third structure 103. Various types of mechanical coupling, for example, may correspond to crimping, stamping, thermally-conductive-adhesives melding, using lap joints, encapsulating, shrink fitting, and interface fitting.

Figure 2:
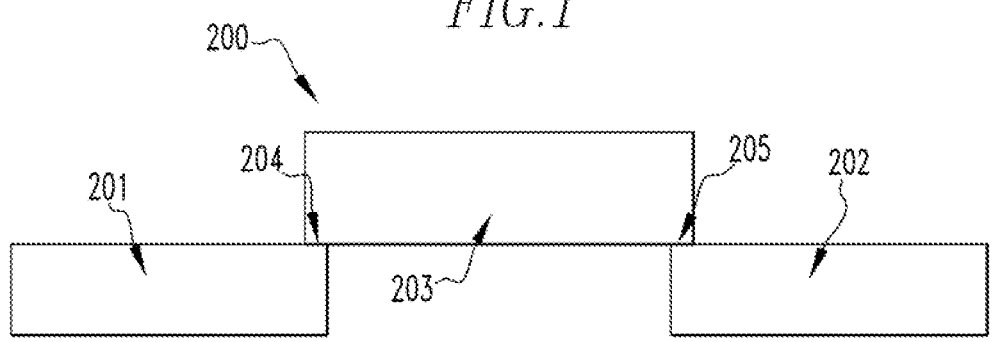
FIG. 2 is another illustrative schematic diagram of a dielectric heat path device in accordance with an embodiment of the disclosed concept.

FIG. 2 is another illustrative schematic diagram of a dielectric heat path device 200 in accordance with an embodiment of the disclosed concept. In the exemplary, non-limiting, embodiment, device 200 includes a first structure 201, a second structure 202, and a third structure 203. As seen in FIG. 2, first structure 201 and second structure 202 are located in a different plane than third structure 203 such that third structure 203 overlaps one end of first structure 201 and one end of second structure 202. First structure 201, second structure 202, and third structure 203, in one embodiment, are be substantially similar to first structure 101, second structure 102, and third structure 103 of FIG. 1, and the previous description may apply. As shown in FIG. 2, in some embodiments, first structure 201 may be substantially parallel with third structure 203. In some embodiments, as shown in FIG. 2, second structure 202 may be substantially parallel with third structure 203.

In the exemplary embodiment, third structure 203 is positioned above first structure 201 and second structure 202 such that a first end of third structure 203 overlaps at intersection 204 with a first end of first structure 201. For example, a portion of a bottom side of third structure 203 rests on a corresponding portion of the top side of first structure 201. An amount of overlap of third structure 203 and first structure 201 varies depending on a number of factors including an amount of heat that needs to be transferred and ultimately dissipated thereby. For example, if a large amount of heat is to be transferred, the amount of overlap between first structure 201 and third structure 203 is large (e.g. an overlap distance exceeding the width, radius, or depth of third structure 203). As another example, if a minimal amount of heat is to be transferred, the amount of overlap between first structure 201 and third structure 203 may be small (e.g., an overlap distance less than the width, radius, or depth of third structure 203) At an intersection 204, located between first structure 201 and third structure 203, the overlapping portion between the first end of third structure 203 is mechanically and thermally coupled to the second end of first structure 201. Furthermore, the second end of third structure 203 overlaps with a first end of second structure 202 such that a portion of the bottom side of third structure 203 rests on a portion of the top side of second structure 202. At intersection 205, the overlap between the top side of second structure 202 and the bottom side of third structure 203, the second end of third structure 203 is mechanically coupled and thermally coupled to the first end of second structure 202.

Figure 3:
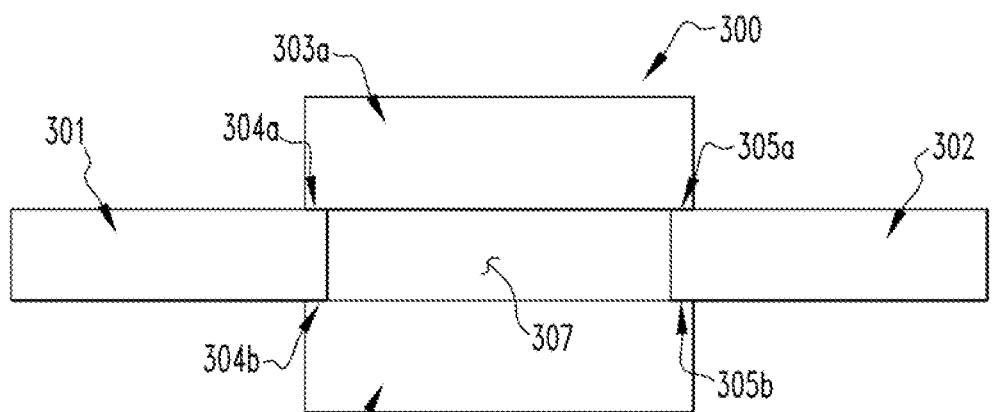
FIG. 3 is yet another illustrative schematic diagram of a dielectric heat path device in accordance with an embodiment of the disclosed concept.

FIG. 3 is yet another illustrative schematic diagram of a dielectric heat path device 300 in accordance with an embodiment of the disclosed concept. Device 300, in the exemplary, non-limiting, embodiment, includes a first structure 301, a second structure 302, a third structure 303*a*, and a fourth structure 303*b*. As seen in FIG. 3, first structure 301 and second structure 302 are located in a different plane than third structure 303*a* such that third structure 303*a* overlaps one end of first structure 301 and one end of second structure 302. Additionally, fourth structure 303*b* is located in a different plane than first structure 301, second structure 302 and third structure 303*a* such that fourth structure 303*b* overlaps one end of first structure 301 and one end of second structure 302. In one embodiment, first structure 301 and second structure 302 may be substantially similar to first structure 101 and second structure 102 of FIG. 1, and the previous description may apply.

First structure 301, has a first end, a second end, a top side, and a bottom side. First structure 301 is made of a thermally conductive material. While first structure 301 is made of a thermally conductive material, the material may also conduct electricity. First structure 301 may also be substantially rectangular in shape.

Second structure 302 has a first end, a second end, a top side, and a bottom side. Second structure 302 is made of a thermally conductive material. While second structure 302 is made of a thermally conductive material, the material may also conduct electricity. Second structure 302 may be substantially rectangular in shape.

In the exemplary embodiment, device 300 includes third structure 303*a*, which is formed of a dielectric material (e.g., similar to the dielectric material of third structure 103 of FIG. 1), and is structured such that, at intersection 304*a*, a first end of third structure 303*a* overlaps with a portion of the first end of first structure 301. For example, a portion of the bottom side of third structure 303*a* is located on a portion of the top side of first structure 301. In one embodiment, the first end of third structure 303a is mechanically coupled and thermally coupled to the first end of first structure 301. In one embodiment, a second end of third structure 303a also overlaps with the first end of second structure 302, at intersection 305a, such that a portion of the bottom side of third structure 303a is located on a portion of the top side of second structure 302. Similarly to intersection 304a, at intersection 305a, a bottom side of third structure 303a at the second end thereof is mechanically coupled and thermally coupled to the first end of second structure 302.

Device 300, in the exemplary embodiment, also includes fourth structure 303b, which is also formed of a dielectric material (e.g., similar to the dielectric material of third structure 103 of FIG. 1 and/or third structure 303a). Fourth structure 303b includes a first end, a second end, a top side, and a bottom side. Additionally, device 300 is further structured such that fourth structure 303b is positioned on an opposite side of both first structure 301 and second structure 302 relative to third structure 303a. For example, the first end of fourth structure 303b, in the non-limiting embodiment, overlaps with the first end of first structure 301, at intersection 304b, such that a portion of the top side of fourth structure 303b is located on a portion of the bottom side of first structure 301. Furthermore, the first end of fourth structure 303b is mechanically coupled and thermally coupled to the second end of first structure 301. Additionally, device 300 is structured such that the second end of fourth structure 303b overlaps with the first end of second structure 301 such that a portion of the top side of fourth structure 303b is located on a portion of the bottom side of second structure 302. Similarly to intersection 304b, a bottom side of second structure 302 and the top side of fourth structure 303b, at the second end of fourth structure 303b is mechanically coupled and thermally coupled to the first end of second structure 302. The positioning of third structure 303a and fourth structure 303b creates a gap 307. Gap 307 may be any gas including, but not limited to air.

Figure 4:
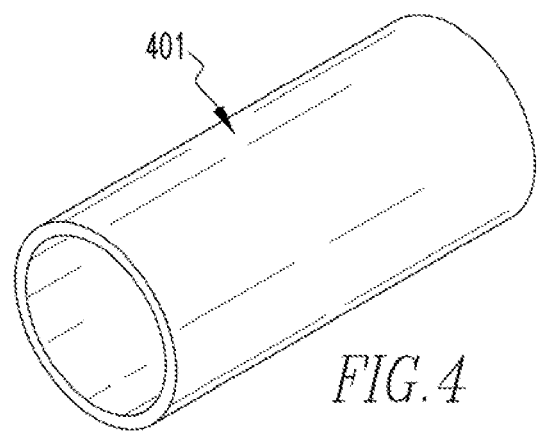
FIG. 4 is an illustrative schematic diagram of a cover for a dielectric heat path device, in accordance with an embodiment of the disclosed concept.

FIG. 4 is an illustrative schematic diagram of a cover 401 for a dielectric heat path device, in accordance with an embodiment of the disclosed concept. Cover 401, in one exemplary embodiment, is structured such that it encapsulates various portions of devices 100, 200, and/or 300. Cover 401 thermally insulates, provides spacing, or enables attachment to the various portions it encapsulates. Any suitable material that thermally insulates, provides spacing, or enables attachment to one or more structures, such as those of FIGS. 1-4, may be used to form cover 401 including, but not limited to, polymers, polymer composites, filled polymers, cellulosics, ceramics, and/or fiberglass. In one exemplary embodiment, cover 401 is substantially cylindrical in shape. In another exemplary embodiment, cover 401 alternatively, or additionally, hollow so that an device (e.g., device 100, 200, and/or 300) is insulated, provides spacing, or enables attachment by cover 401. A more detailed description of the cover in relation to a device in this disclosed concept may be found in FIGS. 5A, 5B, 6A, 6B, 7A, 7B, 9A, and 9B.

Figure 5A:
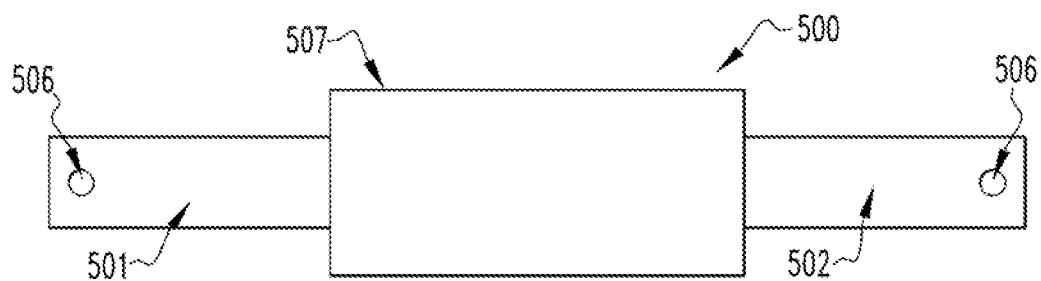
FIG. 5A is an illustrative schematic diagram of the dielectric heat path device of FIG. 1, shown employing the cover of FIG. 4, in accordance with an embodiment of the disclosed concept.
Figure 5B:
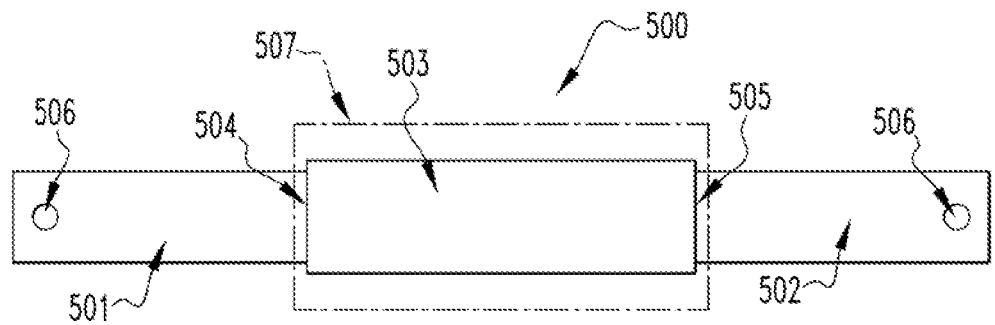
FIG. 5B is another illustrative schematic diagram of the dielectric heat path device of FIG. 1 including the cover of FIG. 4, with the cover shown in phantom line drawing to show hidden structures.

FIG. 5A is an illustrative schematic diagram of the dielectric heat path device 500 of FIG. 1, shown employing the cover 507 of FIG. 4, in accordance with an embodiment of the disclosed concept. Device 500 is substantially similar to device 100 with the exception that device 500 further cover 507. Device 500, in the exemplary embodiment, includes a first structure 501, a second structure 502, a third structure 503, and cover 507, which are substantially similar to first structure 101, second structure 102, third structure 103, and cover 401 of FIGS. 1 and 4, respectively, and the previous description will apply. Device 500 is structured such that heat is conducted by first structure 501 and communicated from first structure 501 to second structure 502 via a heat path formed there between by third structure 503, as shown in FIG. 5B. Cover 507 serves to insulate device 500 such that any heat dissipated out of structures 501-503 does not escape into the ambient environment, thereby raising the external temperature of any devices located nearby. Thus, cover 507 ensures that heat conducted by first structure 501 is properly communicated to a heat sink coupled to a second end of second structure 502. This greatly reduces any heat flow from device 500 to the ambient environment, thereby preventing any damage that could occur due to overheating of nearby components.

FIG. 5B is another illustrative schematic diagram of the dielectric heat path 500 device of FIG. 1 including the cover 507 of FIG. 4, with the cover 507 shown in phantom line drawing to show hidden structures. Cover 507, as seen by the phantom dotted lines, substantially surrounds third structure 503. In doing so, cover 507 is configured to thermally insulates third structure 503 reducing the heat lost as heat is transferred from first structure 501 to second structure 502. In some embodiments, cover 507 encapsulates a portion of first structure 501 and/or second structure 502. The portions of first structure 501 and/or second structure 502 encapsulated by cover 507 are, therefore, thermally insulated by cover 507.

Additionally, in one embodiment, cover 507 is structures such that it provides mechanical coupling of third structure 503 to first structure 501 and second structure 502. In this embodiment, the first end of third structure 503 is mechanically coupled at intersection 504 to the second end of first structure 501 by cover 507. Furthermore, the second end of third structure 503 is mechanically coupled at intersection 505 to the first end of second structure 502 by cover 507.

While FIGS. 5A and 5B show cover 507 encapsulating only a portion of device 500, in some embodiments cover 507 encapsulates the entirety of device 500. Furthermore, when cover 507 encapsulates all of device 500, cover 507 is configured to provide thermal insulation for each of structures 501-503 of device 500. Additionally, although only one cover 507 is shown in FIGS. 5A and 5B, more than one cover 507 may be used within device 500 and/or cover 507 may be formed of more than one piece (e.g., multiple pieces).

Figure 6A:
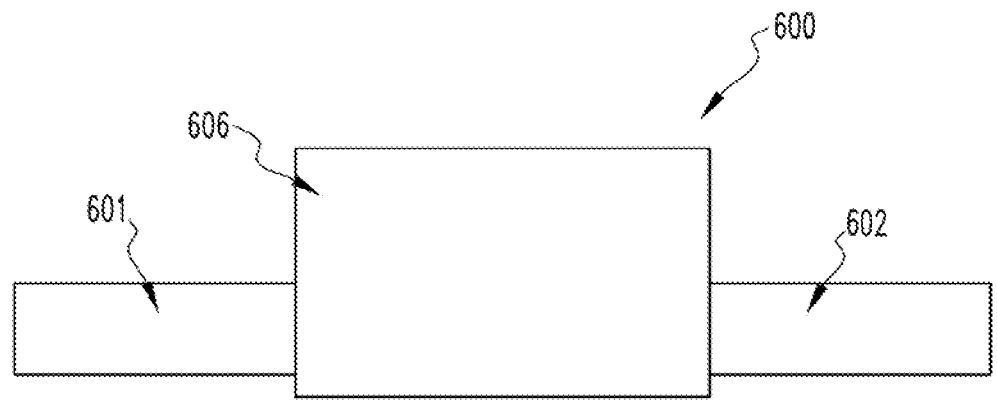
FIG. 6A is an illustrative schematic diagram of the dielectric heat path device of FIG. 2 shown employing the cover of FIG. 4, in accordance with an embodiment of the disclosed concept.

FIG. 6A is an illustrative schematic diagram of the dielectric heat path device 600 of FIG. 2 shown employing the cover 606 of FIG. 4, in accordance with an embodiment of the disclosed concept. Device 600 is substantially similar to device 200 of FIG. 2, with the exception that device 600 also includes cover 606. Device 600, in the exemplary embodiment, includes a first structure 601, a second structure 602, a third structure 603, and cover 606, which are substantially similar to first structure 201, second structure 202, third structure 203, and cover 401 of FIGS. 2 and 4, respectively, and the previous description applies. Similarly to device 500 of FIG. 5A, device 600 is structured such that it conducts heat from first structure 601, and the heat is then communicated from first structure 601 to second structure 602 via a heat path formed there between. Furthermore, similarly to cover 507, cover 606 serves to insulate device 600 such that any heat dissipated out of structures 601-603 does not escape into the ambient environment.

Figure 6B:
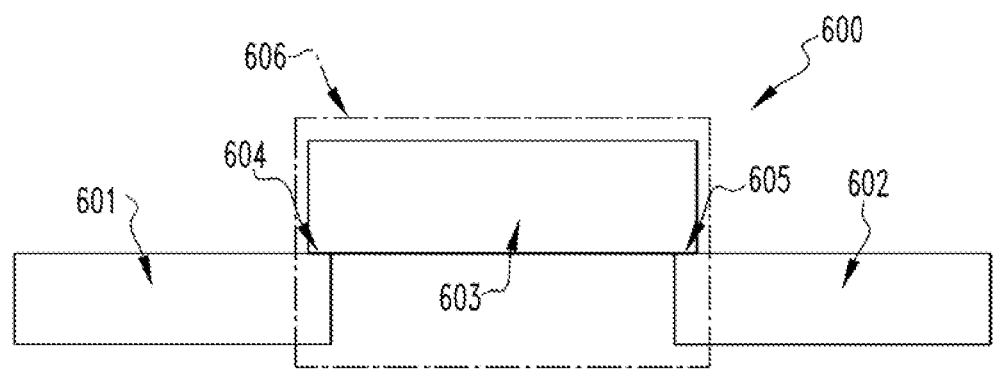
FIG. 6B is another illustrative schematic diagram of the dielectric heat path device of FIG. 2 including the cover of FIG. 4, with the cover shown in phantom line drawing to show hidden structures.

FIG. 6B is another illustrative schematic diagram of the dielectric heat path device 600 of FIG. 2 including the cover 606 of FIG. 4, with the cover 606 shown in phantom line drawing to show hidden structures. Cover 606, as seen by the phantom dotted lines, encapsulates third structure 603, in the illustrated embodiment. By encapsulating third structure 603, cover 606 is configured to thermally insulate third structure 603, thereby reducing heat lost as heat is transferred from first structure 601 to second structure 602. In some embodiments, cover 606 further encapsulates various portions of first structure 601 and/or second structure 602. Any portions of first structure 601 and/or second structure 602 that are encapsulated by cover 606 are, therefore, thermally insulated by cover 606.

Additionally, in one embodiment, cover 606 is structured such that is provides mechanical coupling of third structure 603 to first structure 601 and second structure 602. In this embodiment, the first end of third structure 603 is mechanically coupled at intersection 604 to the second end of the first structure 601 by cover 606. Furthermore, the second end of third structure 603 is mechanically coupled at intersection 605 to the first end of second structure 602 by cover 606.

While FIGS. 6A and 6B show cover 606 encapsulating only a portion of device 600, in some embodiments cover 606 encapsulates the entirety of device 600. Furthermore, when cover 606 encapsulates all of device 600, cover 606 is configured to provide thermal insulation for each of structures 601-603 of device 600. Additionally, although only one cover 606 is shown in FIGS. 6A and 6B, more than one cover 606 may be used within device 600 and/or cover 606 may be formed of more than one piece (e.g., multiple pieces).

Figure 7A:
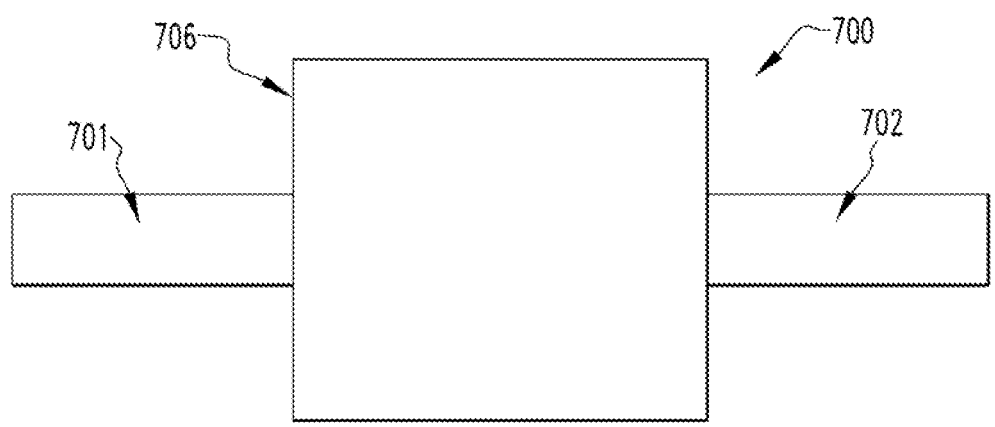
FIG. 7A is an illustrative schematic diagram of the dielectric heat path device of FIG. 3 shown employing the cover of FIG. 4, in accordance with an embodiment of the disclosed concept.

FIG. 7A is an illustrative schematic diagram of the dielectric heat path device 700 of FIG. 3 shown employing the cover 706 of FIG. 4, in accordance with an embodiment of the disclosed concept. Device 700 is substantially similar to device 300 of FIG. 3, with the exception that device 700 also includes cover 706. Device 700, in one exemplary embodiment, includes a first structure 701, a second structure 702, a third structure 703a, a fourth structure 703b, and cover 706, which are substantially similar to first structure 301, second structure 302, third structure 303a, fourth structure 303b, and cover 401 of FIGS. 3 and 4, respectively, and the previous description applies.

Figure 7B:
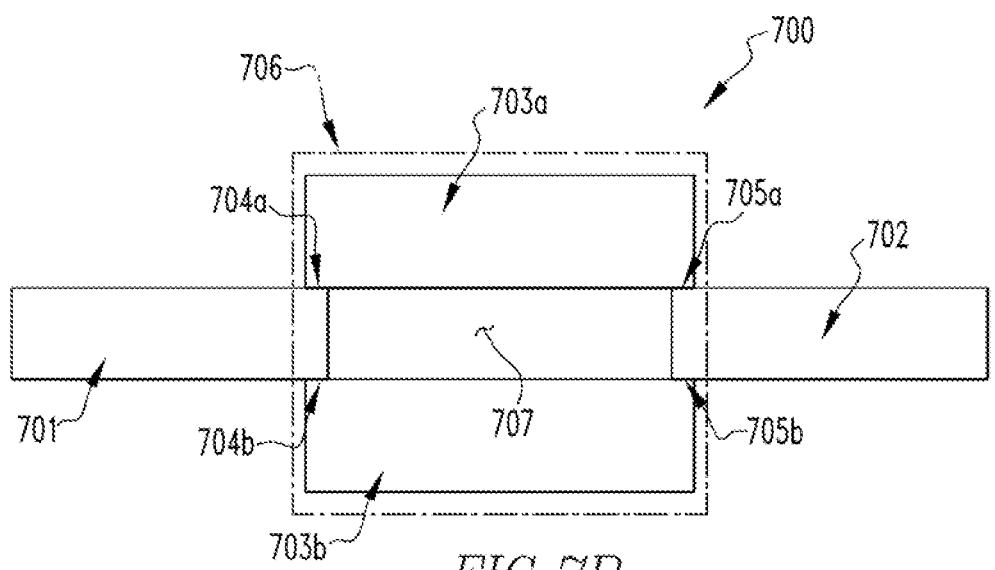
FIG. 7B is another illustrative schematic diagram of the dielectric heat path device of FIG. 3 including the cover of FIG. 4, with the cover shown in phantom line drawing to show hidden structures.

FIG. 7B is another illustrative schematic diagram of the dielectric heat path device 700 of FIG. 3 including the cover 706 of FIG. 4, with the cover 706 shown in phantom line drawing to show hidden structures. First structure 701, has a first end, a second end, a top side, and a bottom side. First structure 701 is made of a thermally conductive material. While first structure 701 is made of a thermally conductive material, the material may also conduct electricity. First structure 701 may also be substantially rectangular in shape. First structure 701 is also substantially similar to first structure 301.

Second structure 702 has a first end, a second end, a top side, and a bottom side. Second structure 702 is made of a thermally conductive material. While second structure 702 is made of a thermally conductive material, the material may also conduct electricity. Second structure 702 may be substantially rectangular in shape. Second structure 702 is also substantially similar to second structure 302.

Third structure 703a has a first end, a second end, a top side, and a bottom side. Third structure 703a is made of a dielectric material. Like first structure 701 and second structure 702, third structure 703a may be substantially rectangular in shape. Third structure 703a is positioned above first structure 701 and second structure 702. The first end of third structure 703a overlaps with the first end of first structure 701 such that a portion of the bottom side of third structure 703a rests on a portion of the top side of first structure 701. At intersection 704a, the overlap between the top side of first structure 701 and the bottom side of third structure 703a, the first end of third structure 703a is mechanically coupled and thermally coupled to the first end of first structure 701. The second end of third structure 703a overlaps with the first end of second structure 701 such that a portion of the bottom side of third structure 703a rests on a portion of the top side of second structure 702. At intersection 705a, the overlap between the top side of second structure 702 and the bottom side of third structure 703a, the second end of third structure 703a is mechanically coupled and thermally coupled to the first end of second structure 702. Third structure 703a is substantially similar to third structure 303a.

Fourth structure 703b has a first end, a second end, a top side, and a bottom side. As with third structure 703a, fourth structure 703b is made of a dielectric material. Additionally, similarly to third structure 703a, fourth structure 703b may be substantially rectangular in shape. Fourth structure 703b is positioned below first structure 701 and second structure 702. The first end of fourth structure 703b overlaps with the first end of first structure 701 such that a portion of the top side of fourth structure 703b rests on a portion of the bottom side of first structure 701. At intersection 704b, the overlap between the bottom side of first structure 701 and the top side of fourth structure 703b, the first end of fourth structure 703b is mechanically coupled and thermally coupled to the first end of first structure 701. The second end of fourth structure 703b overlaps with the first end of second structure 701 such that a portion of the top side of fourth structure 703b rests on a portion of the bottom side of second structure 702. At intersection 705b, the overlap between the bottom side of second structure 702 and the top side of fourth structure 703b, the second end of fourth structure 703b is mechanically coupled and thermally coupled to the first end of second structure 702. Fourth structure 703b is substantially similar to fourth structure 303b. The positioning of third structure 703a and fourth structure 703b creates a gap 707. Gap 707 may be any gas including, but not limited to air.

Cover 706, as seen by the phantom dotted lines, encapsulates third structure 703a and fourth structure 703b. By encapsulating third structure 703a and fourth structure 703b, cover 706 thermally insulates both third structure 703a and fourth structure 703b. The thermal insulation reduces the heat lost as it is transferred from first structure 701 to second structure 702. In some embodiments, cover 706 encapsulates a portion of first structure 701 and second structure 702. The portions of first structure 701 and second structure 702 encapsulated by cover 706 are thermally insulated by cover 706.

Additionally, in some embodiments, mechanically coupling is accomplished by cover 706. In this embodiment, the first end of third structure 703a is mechanically coupled at intersection 704a to the second end of first structure 701 by cover 706. The second end of third structure 703a is mechanically coupled at intersection 705a to the first end of second structure 702 by cover 706. Additionally, the first end of fourth structure 703b is mechanically coupled at intersection 704b to the first end of first structure 701 by cover 706. The second end of fourth structure 703b is mechanically coupled at intersection 705b to the first end of second structure 702 by cover 706.

While FIGS. 7A and 7B show cover 706 encapsulating only a portion of device 700, in some embodiments cover 706 encapsulates the entirety of device 700. Furthermore, when cover 706 encapsulates all of device 700, cover 706 thermally insulates all of device 700.

Figure 8:
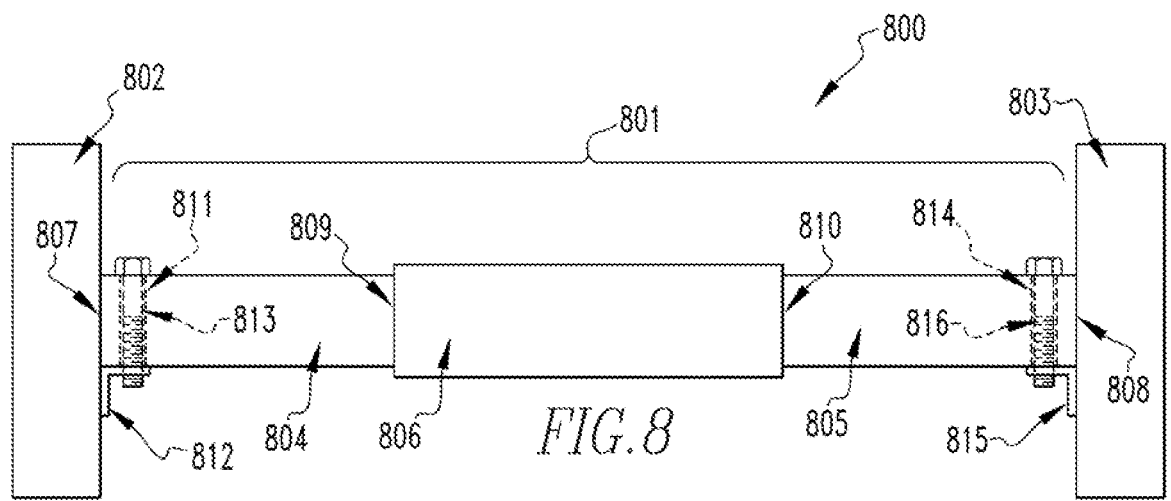
FIG. 8 is an illustrative schematic diagram of a system for assisting in heat dissipation in accordance with an embodiment of the disclosed concept.

FIG. 8 is an illustrative schematic diagram of a system 800 for assisting in heat dissipation in accordance with an embodiment of the disclosed concept. System 800 includes a dielectric heat path device 801, a heat generating device 802, and a secondary device 803. Persons of ordinary skill in the art will recognize that system 800 may include any number of structures, and one or more additional structures or components may be added or omitted without deviating from the scope of the present disclosure.

Dielectric heat path device 801 is substantially similar to device 100 of FIG. 1, however other devices, such as devices 200 and 300 of FIGS. 2 and 3, respectively, are also capable of being used within system 800. Device 801, in the exemplary embodiment, includes a first structure 804, a second structure 805, and a third structure 806, which in one embodiment are substantially similar to first structure 101, second structure 102, and third structure 103 of FIG. 1, and the previous description applies. Device 801 is configured such that first structure 804 conducts heat generated by a heat generating device 802, as first structure 804 and heat generating device 802 are in thermal, as well as electrical, in one embodiment, communication. Heat is then communicated from first structure 804 to second structure 805 via a heat path formed by third structure 806 in thermal communication with both first structure 804 and second structure 805.

Heat generating device 802 corresponds to any device that is capable of generating heat that needs to be effectively and efficiently dissipated, including, but not limited to, electrical current carrying devices, load centers, panel boards, cable boxes, and/or generators. Heat generating device 802, in the illustrated embodiment, is thermally coupled to the first end of first structure 804. Mechanically coupled to heat generating device 802 is a bracket 812. Bracket 812, for example, is aligned with a hole 811 within first structure 804 such that a bolt 813 is capable of being inserted there through, thereby mechanically coupling first structure 804 to bracket 812, and, thus, coupling first structure 804 and heat generating device 802. While bracket 812 and bolt 813 are used to mechanically couple first structure 804 to heat generating device 802, a person having ordinary skill in the art would recognize that heat generating device 802 and first structure 804 can be mechanically coupled through the use of any suitable coupling technique (e.g., ties, adhesives, pressure fits, etc.).

In one embodiment, secondary device 803 may be any device that efficiently dissipates heat, such as a heat sink, enclosure box, attachment bar, bus, lid, fin, lug, conductor, structure, bracket, boss, attachment, or termination. Secondary device 803 is thermally coupled to the first end of second structure 805. Furthermore, in one embodiment, a bracket 815 is mechanically coupled to secondary device 803 using a bracket 815. Bracket 815 aligns a hole 814 so that a bolt 816 inserted there through, mechanically couples second structure 805 to bracket 815, thereby coupling second structure 805 and secondary device 803 together. While bracket 815 and bolt 816 are used to mechanically couple second structure 805 to secondary device 803, a person having ordinary skill in the art would recognize that secondary device 803 and second structure 805 can be mechanically coupled through any suitable mechanism.

System 800 allows heat to transfer from heat generating device 802 to secondary device 803 through device 801. In some embodiments, secondary device 803 is thermally grounded such that when heat is received by secondary device 803, the heat dissipates. Because of the dielectric materials used for third structure 806, device 801 can be thermally grounded without the fear of electrically grounding electrical device 803.

Figure 9A:
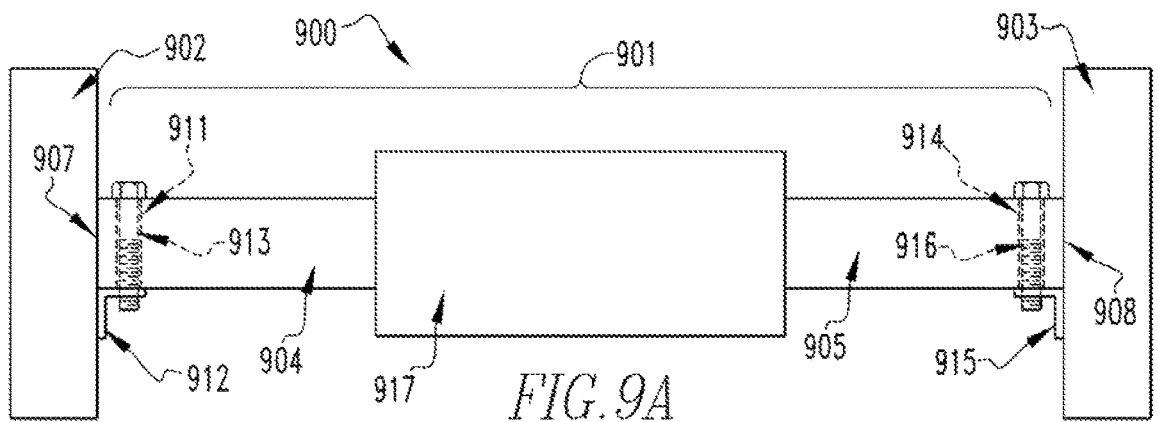
FIG. 9A is an illustrative schematic diagram of the system of FIG. 8, shown employing the cover of FIG. 4, in accordance with an embodiment of the disclosed concept.

FIG. 9A is an illustrative schematic diagram of the system 800 of FIG. 8, shown employing the cover 917 of FIG. 4, in accordance with an embodiment of the disclosed concept. System 900 is substantially similar to system 800 with the exception that system 900 includes cover 917. System 900 includes a device 901, a heat generating device 902, and a secondary device 903, which in one embodiment, are substantially similar to device 801, heat generating device 802, and secondary device 803, and the previous description apply.

System 900 allows heat to transfer from heat generating device 902 to secondary device 903 through dielectric heat path device 901. In some embodiments, secondary device 903 is thermally grounded such that when heat is received by secondary device 903, the heat dissipates. Because of the dielectric materials used for third structure 906, device 901 can be thermally grounded without the fear of electrically grounding electrical device 903.

Figure 9B:
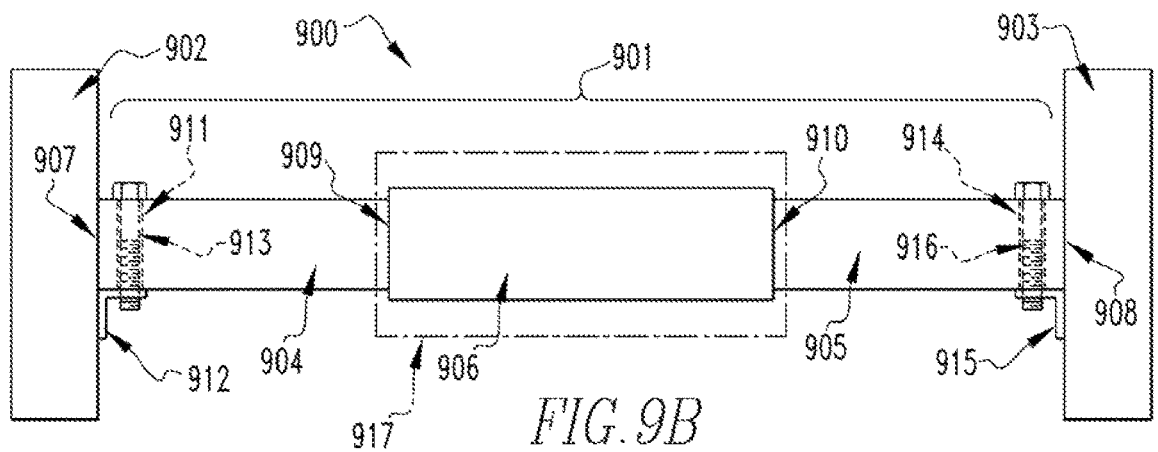
FIG. 9B is another illustrative schematic diagram of the system of FIG. 8 including the cover of FIG. 4, with the cover shown in phantom line drawing to show hidden structures.

FIG. 9B is another illustrative schematic diagram of the system 900 of FIG. 9A including the cover 917 of FIG. 4, with the cover 917 shown in phantom line drawing to show hidden structures. Device 901 is substantially similar to device 500. Device 901 includes first structure 904, second structure 905, third structure 906, and cover 917. Persons of ordinary skill in the art will recognize that device 901 may include any number of structures and one or more additional structures or components may be added or omitted without deviating from the scope of the present disclosure. Additionally, one or more structures may be combined or separated, and multiple instances of various components are also possible, however only one of each structure is shown within device 901 for simplicity. Device 901 conducts heat from first structure 904. The heat is then communicated from first structure 904 to second structure 905 through third structure 906. While the heat is being transferred, the heat is insulated by cover 917.

First structure 904, has a first end, a second end, a top side, and a bottom side. First structure 904 is made of a thermally conductive material. While first structure 904 is made of a thermally conductive material, the material may also conduct electricity. First structure 904 may be substantially rectangular in shape. There is at least one hole 911 on the first end of first structure 904 so that the first structure may be attached to heat generating device 902. Hole 911 and first structure 904 are substantially similar to hole 506 and first structure 501 respectively.

Second structure 905 has a first end, a second end, a top side, and a bottom side. Second structure 905 is made of a thermally conductive material. While second structure 905 is made of a thermally conductive material, the material may also conduct electricity. Second structure 905 may be substantially rectangular in shape. There is at least one hole 914 on the second end of second structure 905 so that the second structure may be attached to secondary device 903. Hole 914 and second structure 905 are substantially similar to hole 506 and second structure 502 respectively.

Third structure 906 has a first end, a second end, a top side, and a bottom side. Third structure 906 is made of a dielectric material. Similarly to first structure 904 and second structure 905, third structure 906 may be substantially rectangular in shape. Third structure 906 is substantially similar to third structure 503. The first end of third structure 906 is mechanically coupled and thermally coupled at intersection 909 to the second end of first structure 904. The second end of third structure 906 is mechanically coupled and thermally coupled at intersection 910 to the second end of second structure 905.

Cover 917, as seen by the phantom dotted lines, covers third structure 906. In doing so, cover 917 thermally insulates third structure 906 reducing the heat lost as it is transferred from first structure 904 to second structure 905. In some embodiments, cover 917 encapsulates a portion of first structure 904 and second structure 905. The portions of first structure 904 and second structure 905 encapsulated by cover 917 are thermally insulated by cover 917.

Additionally, in some embodiments, mechanically coupling is accomplished by cover 917. In this embodiment, the first end of third structure 906 is mechanically coupled at intersection 909 to the second end of first structure 904 by cover 917. The second end of third structure 906 is mechanically coupled at intersection 910 to the second end of second structure 905 by cover 917.

While FIGS. 9A and 9B show cover 917 encapsulating only a portion of device 901, in some embodiments cover 917 encapsulates the entirety of device 901. Furthermore, when cover 917 encapsulates all of device 901, cover 917 thermally insulates all of device 901.

Figure 10:
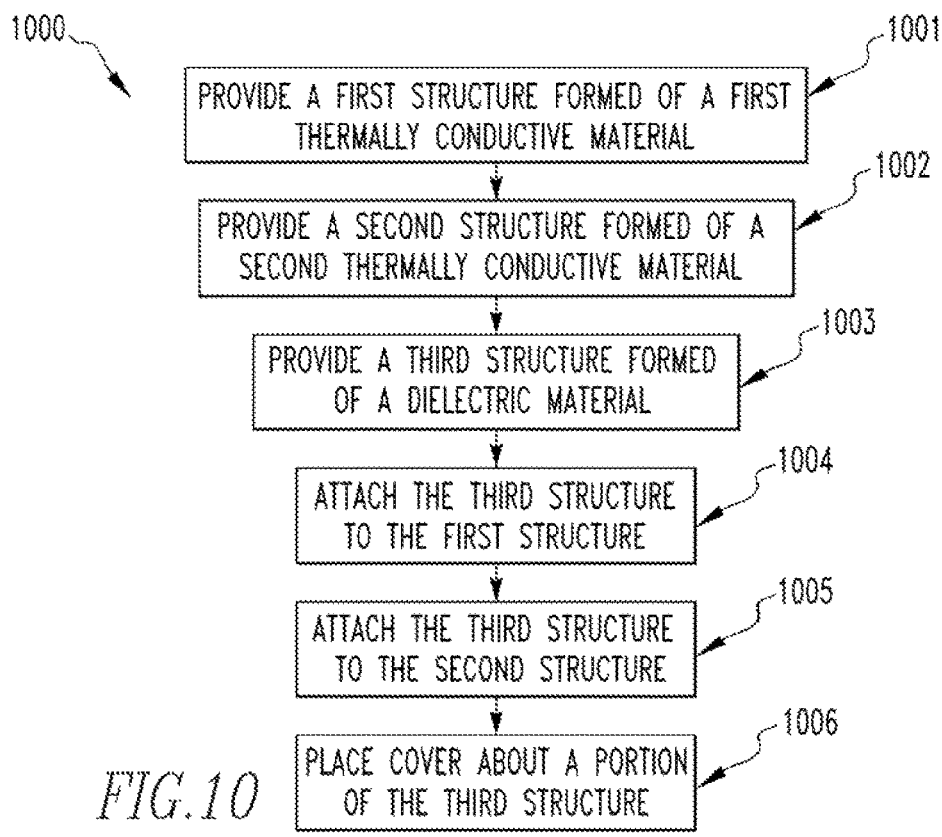
FIG. 10 is an illustrative flowchart of a method for assembling a dielectric heat path device in accordance with an embodiment of the disclosed concept.

FIG. 10 is an illustrative flowchart of a process 1000 for producing a device, such as devices 100, 200, and/or 300 of FIGS. 1-3, in accordance with an embodiment of the disclosed concept. Process 1000 of FIG. 10, in one embodiment, begins at step 1001. At step 1001, a first structure formed of a first thermally conductive material is provided. Various types of thermally conductive materials include, but are not limited to, metals, alumina, aluminum, brass, bronze, copper, glass, gold, polyethylene, silver, steel, stainless steel, titanium, and/or zinc. The first structure has a first end and a second end. In one embodiment, the first structure is further formed of a material that also conducts electricity.

At step 1002, a second structure formed of a second thermally conductive material is provided. The second structure has a first end and a second end. The second thermally conductive material, in one embodiment, is further formed of a material that also conducts electricity. In one embodiment, both the first structure and the second structure are made of a substantially same material, however this is not required. For example, referring to FIG. 1, first structure 101 may be made of copper while second structure 102 may be made of bronze. Additionally, in one embodiment, both the first structure and the second structure are substantially rectangular in shape, however persons of ordinary skill in the art will recognize that this is merely exemplary.

At step 1003, a structure formed of a dielectric material is provided. Various types of dielectric materials include, but are not limited to, boron nitride, aluminum nitride, aluminum oxide, ceramic, magnesium aluminum silicate, and magnesium silicate compounds. The third structure has a first end and a second end. In one embodiment, the third structure formed a dielectric material is also substantially rectangular in shape, however persons of ordinary skill in the art will recognize that alternative configurations are also possible, and the aforementioned is merely exemplary.

At step 1004, the third structure is attached to the first structure. In one embodiment, the first end of the third structure is mechanically coupled to the first end of the first structure. The first end of the third structure is also thermally coupled to the first end of the first structure. The third structure may be attached to the first structure in a manner substantially similar to the dielectric heat path devices shown in any of FIGS. 1, 2, and 3.

At step 1005, the third structure is attached to the second structure. In one embodiment, the second end of the third structure is mechanically coupled to the first end of the second structure. The second end of the third structure is also thermally coupled to the first end of the second structure. The third structure may be attached to the second structure in a manner substantially similar to the dielectric heat path devices shown in any of FIGS. 1, 2, and 3.

At step 1006 a cover, such as cover 401 of FIG. 4, is placed about a portion of the third structure. In one embodiment, the cover is wrapped around the attached structures (e.g., structures 501, 502, and 503), specifically encapsulating at least the dielectric structure provided in step 1003. The cover, if offering a full membrane of encapsulation, adds thermal insulation around the dielectric structure, thereby reducing heat as heat is transferred across the dielectric heat path device. In other exemplary, non-limiting embodiments, the cover encapsulates portions of the first structure and/or the second structure of steps 1001 and 1002. The portions of the first and second structures encapsulated by the cover are, therefore, also provided with thermal insulation by the cover. Additionally, in some embodiments the cover encapsulates the entire device, thereby thermally insulating the entire dielectric heat path device. Furthermore, in one embodiment, the dielectric heat path device assembled in steps 1004 and 1005 is secured together by the cover. For example, the cover described in step 1006 may be formed using injection molding techniques, and therefore the cover may mechanically secure the assembled structures together.

In one embodiment, the dielectric heat path device is placed into an injection molding machine. There the cover is created around the dielectric heat path device after it has been assembled. The cover then cools, thereby contracting such that the cover mechanically secures the first structure, second structure, and third structure together. Persons of ordinary skill in the art will further recognize that the aforementioned process may also be applicable to dielectric heat path devices including additional structures (e.g., fourth structure 303b), and the aforementioned is merely an illustrative example.

The cover may be formed from any suitable material that is capable of thermally insulating a device, such as a dielectric heat path device 901, including, but not limited to, polymers, polymer composites, filled polymers, cellulosics, ceramics, and/or fiberglass In one embodiment, the cover is substantially cylindrical in shape. The cover additionally, or alternatively, may be hollow so that the device is encapsulated by the cover. For instance, after the first, second, and third structures are assembled together, the cover may be placed over the first, second, and third structures to mechanically secure the dielectric heat path device.

In one embodiment, the dielectric heat path device is attached to an electrical device and a secondary device, similarly to the systems shown in FIGS. 8 and 9. The second end of the first structure is attached to an electrical device (e.g., electrical device 802). The second end of the second device is attached to a secondary device (e.g., secondary device 803). This allows the first structure to conduct heat from an electrical device. The heat is then communicated from first structure to second structure via the third structure. The second structure is then configured to transfer and dissipate the heat by communicating the heat to the secondary device.

Figure 11A:
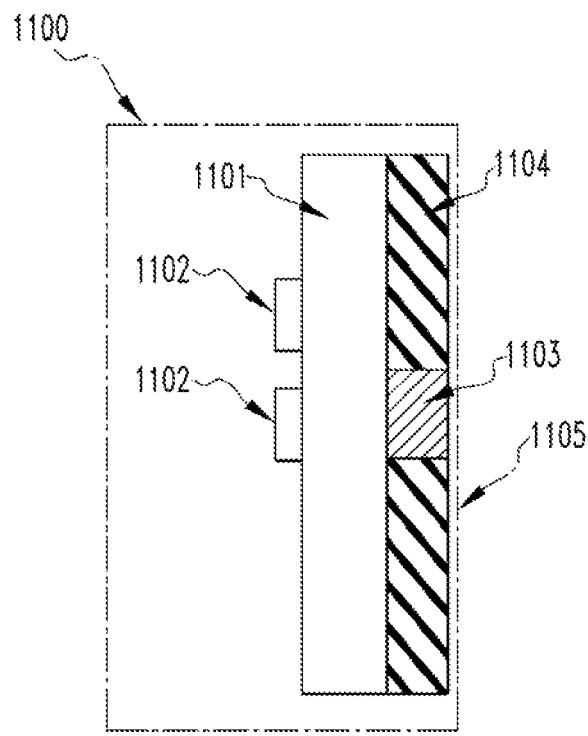
FIG. 11A is an illustrative schematic diagram of a load center in accordance with an embodiment of the disclosed concept.

FIG. 11A is an illustrative schematic diagram of load center 1100 in accordance with an embodiment of the disclosed concept. Load center 1100 may refer to any device or devices that are designed to receive electricity supplied by a power source and distribute it throughout a home, building, or other structure using electricity. As shown in FIG. 11A, load center 1100 includes heat generating component 1101, heat dissipating component 1103, and non-heat generating component 1105 (shown in simplified form in phantom line drawing). Load center 1100 is structured such that heat is conducted from heat generating component 1101 and communicated from heat generating component 1101 to non-heat generating component 1105 via heat dissipating component 1103. In one embodiment, as shown in FIG. 11A, a gap exists between heat dissipating component 1103 and non-heat generating component 1105.

Heat generating component 1101, in an exemplary, non-limiting embodiment, is made of a thermally conductive material. Various types of thermally conductive materials include, but are not limited to, metals, alumina, aluminum, brass, bronze, copper, glass, gold, polyethylene, silver, steel, stainless steel, titanium, and/or zinc. While only one heat generating component 1101 is shown within load center 1100, persons of ordinary skill in the art will recognize that any number of heat generating components may be used. However, for simplicity, only one heat generating component 1101 is shown within lead center 1100. In addition to being thermally conductive, the material that heat generating component 1101 is made of, in one embodiment, is also electrically conductive. Additionally, in an exemplary embodiment, heat generating component 1101 may be a bus bar. Furthermore, various types of heat generating components may include, but are not limited to, main breaker lugs and circuit breakers, electrical straps, wires, ground-fault electronics, arc-fault electronics, other electronics, transformers, capacitors, resistors, power controllers, surge suppressors, motors, magnets, relays, switches, diagnostic devices, diagnostic indictors, or emergency lamps. In another embodiment, heat generating component 1101 may be coupled to insulator 1104 in order to provide thermal insulation for at least a portion of heat generating component 1101. In one embodiment, insulator 1104 is made of a reinforced polymer. Reinforced polymers can include, but are not limited to, fiberglass filled with silica, and aluminum-tri-hydrate. Alternative materials for 1104 are polymers including phenolics, epoxies, polyesters, and thermoplastics. More alternative materials for 1104 are reinforced polymers such as micarta, Garolite™, composites with glass fibers, inorganic fibers, and organic fibers, such as aramid or polyesters, and plasters, cements, and concretes. Furthermore, in another embodiment, heat generating component 1101 may be electrically coupled to circuit breakers 1102. While two circuit breakers 1102 are shown within load center 1100, persons of ordinary skill in the art will recognize that any number of circuit breakers may be used, without departing from the scope of the disclosed concept. Additionally, it will be appreciated that one or more circuit breakers may be combined or separated, and multiple instances of various circuit breakers are also possible.

Heat dissipating component 1103, in an exemplary, non-limiting, embodiment, is made of a dielectric material. Various types of dielectric materials include, but are not limited to, boron nitride, aluminum nitride, aluminum oxide ceramic, magnesium aluminum silicate, and magnesium silicate compounds. In one embodiment, heat dissipating component 1103 may be located within insulator 1104. In another embodiment, heat dissipating component 1103 may be encapsulated by a cover substantially similar to cover 401 of FIG. 4. Although only one heat dissipating component 1103 is shown within load center 1100, persons of ordinary skill in the art will recognize that any number of heat dissipating components may be used, and one or more additional heat dissipating components may be added or omitted. Additionally, one or more heat dissipating components may be combined or separated, and multiple instances of various heat dissipating components are also possible. However, for simplicity, only one heat dissipating component 1103 is shown within load center 1100.

Non-heat generating component 1105, in an exemplary, non-limiting embodiment, is made of a thermally conductive material. Various types of thermally conductive materials include, but are not limited to, metals, alumina, aluminum, brass, bronze, copper, glass, gold, polyethylene, silver, steel, stainless steel, titanium, and/or zinc. In an embodiment, non-heat generating component 1105 is the back panel of load center 1100. While FIG. 11A shows non-heat generating component 1105 as the back panel of load center 1100, persons of ordinary skill will recognize that non-heat generating component 1105 may be any part of load center 1100 that does not generate heat. This may include, but is not limited to side panels, front panels, backpans, backpan extensions, upper trays and back trays, added plates, added fins, enclosure backs, supports, braces, internal covers, lids, doors, hinges or any other internal or enclosure component. In addition to being thermally conductive, the material that non-heat generating component 1105 is made of, in one embodiment, is also electrically conductive.

In an exemplary embodiment, heat dissipating component 1103 is positioned in between, and thermally coupled to, heat generating component 1101 and non-heat generating component 1105. This allows heat generated by heat generating component 1101 to be communicated to non-heat generating component 1105 via heat dissipating component 1103 such that electrical current conducted by heat generating component 1101 is attenuated by heat dissipating component 1103.

In an embodiment, heat dissipating component 1103 is mechanically coupled to heat generating component 1101. In another embodiment, heat dissipating component 1101 is mechanically coupled to non-heat generating component 1105. Furthermore, in yet another embodiment, heat dissipating component 1103 is thermally coupled to circuit breakers 1102. This allows heat generated by circuit breakers 1102 to be communicated to non-heat generating component 1105 via heat dissipating component 1103 such that electrical current conducted by circuit breakers 1102 is attenuated by heat dissipating component 1103.

Figure 11B:
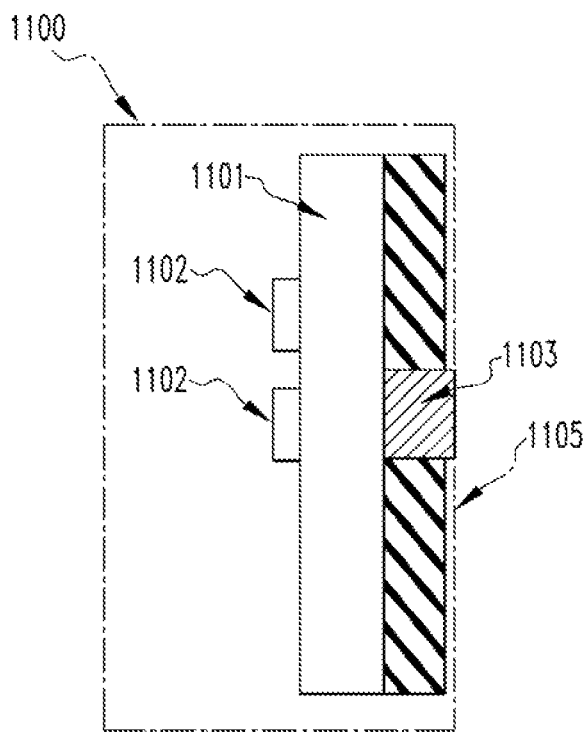
FIG. 11B is another illustrative schematic diagram of a load center in accordance with an embodiment of the disclosed concept.

FIG. 11B is another illustrative schematic diagram of load center 1100 in accordance with an embodiment of the disclosed concept. Load center 1100 has the same components in FIG. 11B as in FIG. 11A and the previous descriptions apply. However, load center 1100 of FIG. 11B shows a different assembly, particularly with the placement of heat dissipating component 1103 in relation to non-heat generating component 1105. In the embodiment shown in FIG. 11B, heat dissipating component 1103 and non-heat generating component 1105 are in contact. Load center 1100 in FIG. 11B is structured such that heat is conducted from heat generating component 1101 and communicated from heat generating component 1101 to non-heat generating component 1105 via heat dissipating component 1103.

Figure 11C:
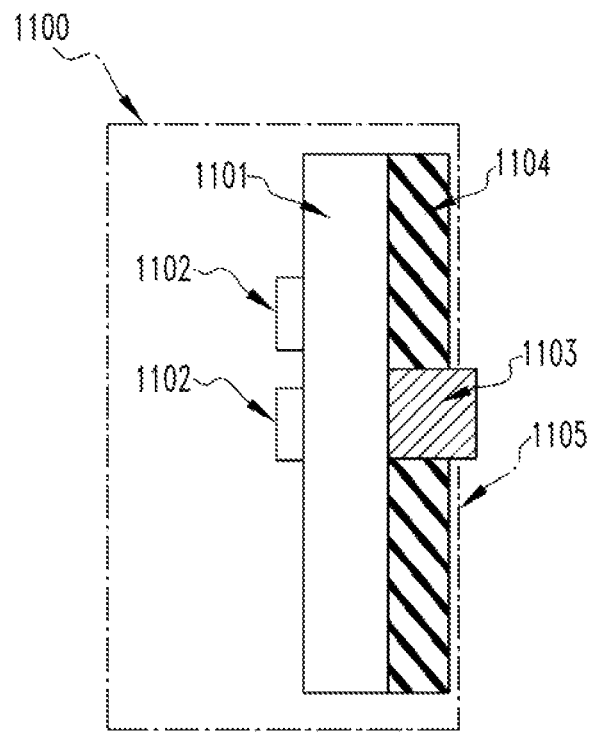
FIG. 11C is another illustrative schematic diagram of a load center in accordance with an embodiment of the disclosed concept.

FIG. 11C is another illustrative schematic diagram of load center 1100 in accordance with an embodiment of the disclosed concept. Load center 1100 has the same components in FIG. 11C as in FIGS. 11A and 11B and the previous descriptions apply. However, load center 1100 of FIG. 11C shows a different assembly, particularly in regards to the placement of heat dissipating component 1103 in relation to non-heat generating component 1105. In the embodiment shown in FIG. 11C, heat dissipating component 1103 protrudes through non-heat generating component 1105. Load center 1100 of FIG. 11C is structured such that heat is conducted from heat generating component 1101 and communicated from heat generating component 1101 to non-heat generating component 1105 via heat dissipating component 1103.

Figure 12A:
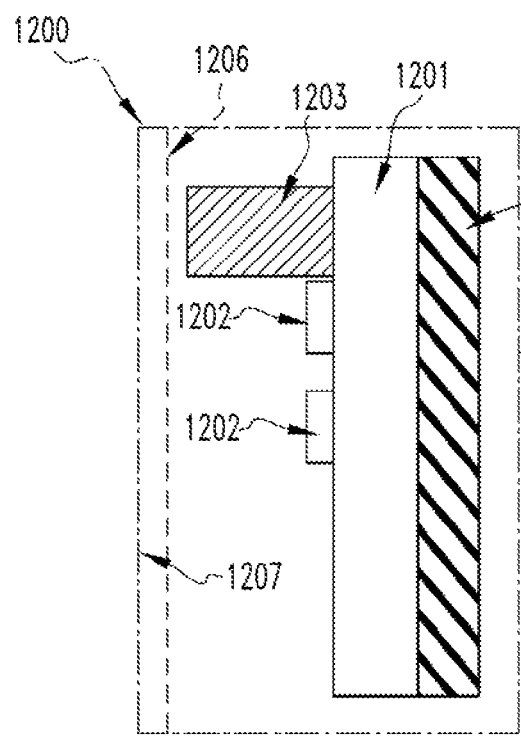
FIG. 12A is an illustrative schematic diagram of a load center in accordance with an embodiment of the disclosed concept.

FIG. 12A is an illustrative schematic diagram of load center 1200 in accordance with an embodiment of the disclosed concept. Load center 1200 and the components therein may be substantially similar to load center 1100 of FIGS. 11A, 11B, and 11C. As shown in FIG. 12A, load center 1200 includes heat generating component 1201, heat dissipating component 1203, and non-heat generating component 1206. In an embodiment, load center 1200 may also include back panel 1205 and front panel 1207. Load center 1200, similar to load center 1100 of FIGS. 11A, 11B, and 11C, is structured such that heat is conducted from heat generating component 1201 and communicated from heat generating component 1201 to non-heat generating component 1206 via heat dissipating component 1203. In one embodiment, as shown in FIG. 12A, a gap exists between heat dissipating component 1203 and non-heat generating component 1206.

Heat generating component 1201 may be substantially similar to heat generating component 1101 of FIGS. 11A, 11B, and 11C and the previous descriptions apply. In an exemplary, non-limiting embodiment, heat generating component 1201 is made of a thermally conductive material. While only one heat generating component 1201 is shown within load center 1200, persons of ordinary skill in the art will recognize that any number of heat generating components may be used. However, for simplicity, only one heat generating component 1201 is shown within load center 1200. In addition to being thermally conductive, the material that heat generating component 1201 is made of, in one embodiment, is also electrically conductive. Additionally, in an exemplary embodiment, heat generating component 1201 may be a bus bar. In another embodiment, heat generating component 1201 may be coupled to insulator 1204. Insulator 1204 is structured to provide thermal insulation for at least a portion of the heat generating component 1201. In an embodiment, insulator 1204 is made of a reinforced polymer. Reinforced polymers can include, but are not limited to fiberglass filled with silica, and aluminum-tri-hydrate. Alternative materials for 1104 are polymers including phenolics, epoxies, polyesters, and thermoplastics. More alternative materials for 1104 are reinforced polymers such as micarta, Garolite™, composites with glass fibers, inorganic fibers, and organic fibers, such as aramid or polyesters, and plasters, cements, and concretes. While a gap is shown between insulator 1204 and back panel 1205, persons of ordinary skill in the art would recognize that this is merely exemplary and insulator 1204 may be in contact with back panel 1205.

In an exemplary embodiment, heat generating component 1201 may be electrically coupled to circuit breakers 1202. While two circuit breakers 1202 are shown within load center 1200, persons of ordinary skill in the art will recognize that any number of circuit breakers may be used and one or more additional circuit breakers may be added or omitted. Additionally, one or more circuit breakers may be combined or separated, and multiple instances of various circuit breakers are also possible.

Heat dissipating component 1203 may be substantially similar to heat dissipating component 1103 of FIGS. 11A, 11B, and 11C and the previous descriptions apply. In an exemplary, non-limiting embodiment, heat dissipating component 1203 is made of a dielectric material. In an embodiment, heat dissipating component 1203 may be encapsulated by a cover substantially similar to cover 401 of FIG. 4. Although only one heat dissipating component 1203 is shown within load center 1200, persons of ordinary skill in the art will recognize that any number of heat dissipating components may be used, and one or more additional heat dissipating components may be added or omitted. Additionally, one or more heat dissipating components may be combined or separated, and multiple instances of various heat dissipating components are also possible. However, for simplicity, only one heat dissipating component 1203 is shown within load center 1200.

Non-heat generating component 1206, in an exemplary, non-limiting embodiment, is made of a thermally conductive material. In one embodiment, non-heat generating component 1206 is the upper pan of load center 1200. In addition to being thermally conductive, the material that non-heat generating component 1206 is made of, in one embodiment, is also electrically conductive.

In an embodiment, heat dissipating component 1203 is positioned in between, and is thermally coupled to, heat generating component 1201 and non-heat generating component 1206. This allows heat generated by heat generating component 1201 to be communicated to non-heat generating component 1206 via heat dissipating component 1203 such that electrical current conducted by heat generating component 1201 is attenuated by heat dissipating component 1203.

Figure 12B:
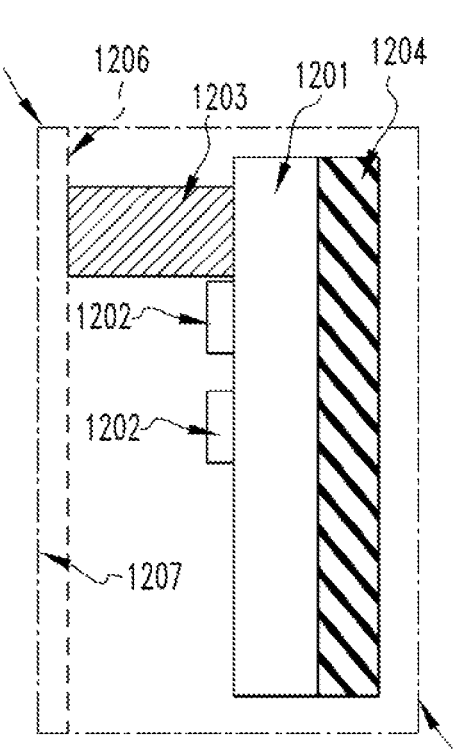
FIG. 12B is another illustrative schematic diagram of a load center in accordance with an embodiment of the disclosed concept.

FIG. 12B is another illustrative schematic diagram of a load center 1200 in accordance with an embodiment of the disclosed concept. Load center 1200 has the same components in FIG. 12B as in FIG. 12A and the previous descriptions apply. However, load center 1200 of FIG. 12B shows a different assembly, particularly in regards to the placement of heat dissipating component 1203 in relation to non-heat generating component 1206. In the embodiment shown in FIG. 12B, heat dissipating component 1203 and non-heat generating component 1206 are in contact. Load center 1200 is structured such that heat is conducted from heat generating component 1201 and communicated from heat generating component 1201 to non-heat generating component 1206 via heat dissipating component 1203.

Figure 12C:
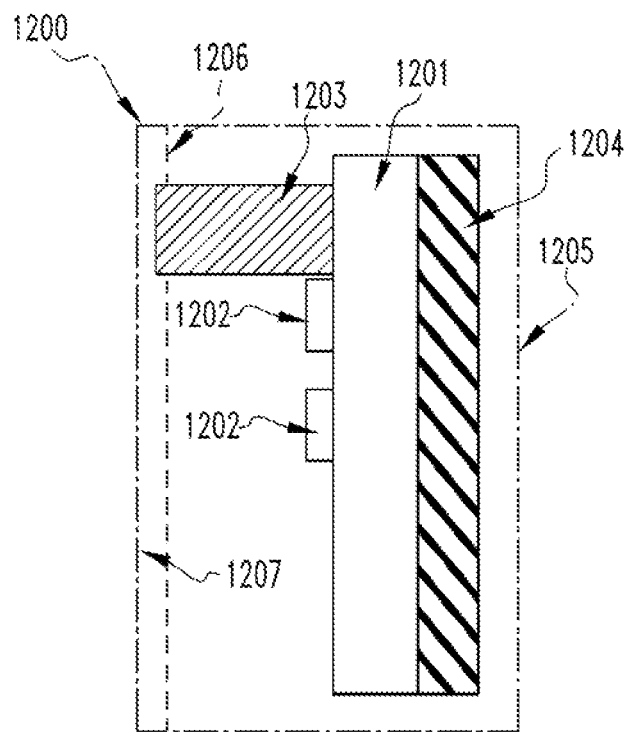
FIG. 12C is another illustrative schematic diagram of a load center in accordance with an embodiment of the disclosed concept.

FIG. 12C is another illustrative schematic diagram of a load center 1200 in accordance with an embodiment of the disclosed concept. Load center 1200 has the same components in FIG. 12C as in FIGS. 12A and 12B and the previous descriptions apply. However, load center 1200 of FIG. 12C shows a different assembly, particularly in regards to the placement of heat dissipating component 1203 in relation to non-heat generating component 1206. In the embodiment shown in FIG. 12C, heat dissipating component 1203 protrudes through non-heat generating component 1206. Load center 1200 is structured such that heat is conducted from heat generating component 1201 and communicated from heat generating component 1201 to non-heat generating component 1206 via heat dissipating component 1203.

Figure 13A:
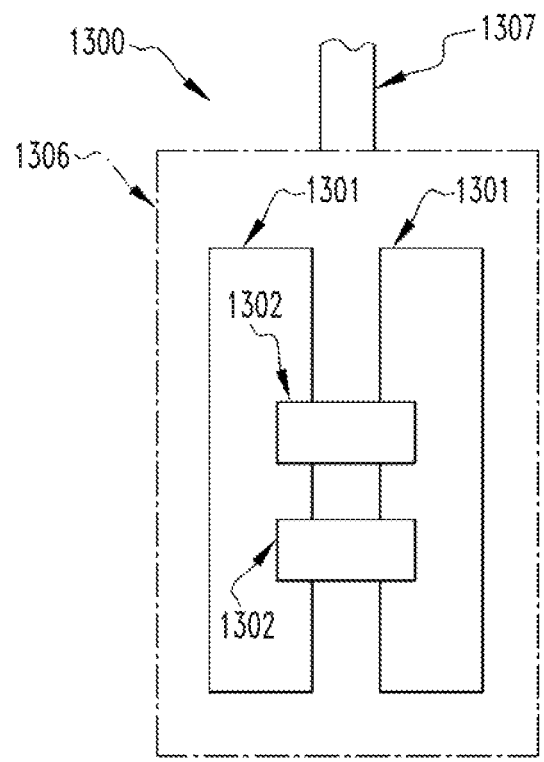
FIG. 13A is a front view of an illustrative schematic diagram of a system for assisting in heat dissipation of a load center in accordance with an embodiment of the disclosed concept.

FIG. 13A is a front view of an illustrative schematic diagram of system 1300 for assisting in heat dissipation of a load center in accordance with an embodiment of the disclosed concept. System 1300 includes load center 1306, power source 1307 and structure 1308 (not shown in FIG. 13A, but see, for example, FIG. 13B). Persons of ordinary skill in the art will recognize that system 1300 may include any number of structures and components, and one or more additional structures or components may be added or omitted without deviating from the scope of the present disclosure.

Figure 13B:
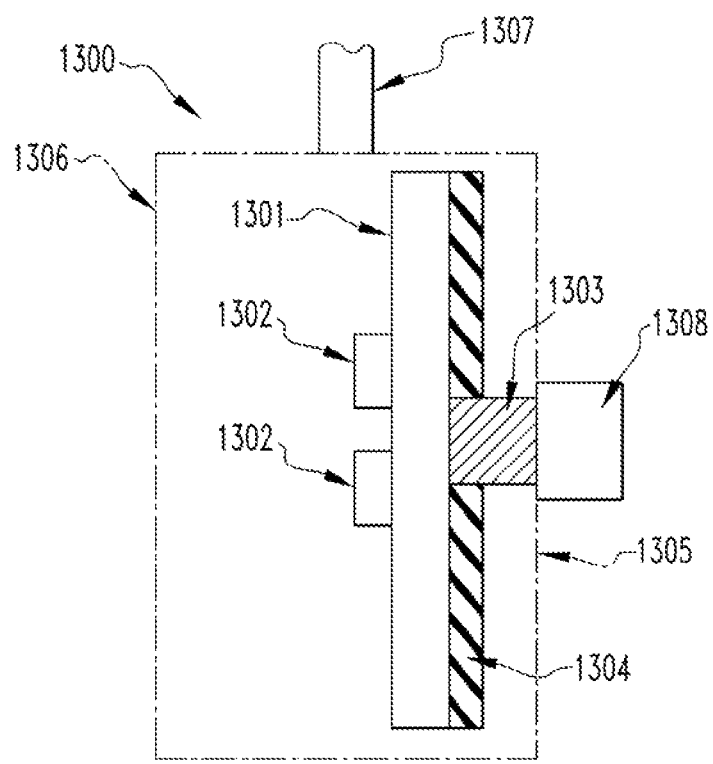
FIG. 13B is an illustrative schematic diagram of the system in FIG. 13A from the side perspective in accordance with an embodiment of the disclosed concept.

FIG. 13B is a side perspective of the illustrative schematic diagram of system 1300 in FIG. 13A in accordance with an embodiment of the disclosed concept. Load center 1306 of system 1300 is substantially similar to load center 1100 of FIG. 11B, however other load centers, such as load center 1200 of FIGS. 12A, 12B, and 12C and load center 1100 of FIGS. 11A and 11C are also capable of being used within system 1300. Load center 1306, in the exemplary embodiment, includes heat generating components 1301, heat dissipating component 1303, and non-heat generating component 1305 which in one embodiment are substantially similar to heat generating component 1101, heat dissipating component 1103, and non-heat generating component 1105 of FIGS. 11A, 11B and 11C and the previous descriptions apply. Load center 1306 is structured such that heat is conducted from heat generating components 1301 and communicated from heat generating components 1301 to non-heat generating component 1305 via heat dissipating component 1303. In one embodiment, as shown in FIG. 13A, heat dissipating component 1303 and non-heat generating component 1305 are touching.

Power Source 1307 corresponds to any device that is capable of providing electricity to a load center, including, but not limited to, electrical current carrying devices, utilities, load centers panel boards, cable boxes, photovoltaic systems, wind turbines, batteries, universal power supplies, capacitors, alternators, and/or generators. In one embodiment, power source 1307, is electrically coupled to heat generating components 1301. In another embodiment, power source 1307 is mechanically coupled to heat generating components 1301. While only one power source 1307 is shown within system 1300, persons of ordinary skill in the art will recognize that any number of power sources may be used. However, for simplicity, only one power source 1307 is shown within system 1300.

Structure 1308, in a non-limiting, exemplary embodiment, is thermally coupled to non-heat generating component 1305. Structure 1308 may be any device that efficiently dissipates heat, such as a dielectric heat path device, heat pipe, heat sink, enclosure box, attachment bar, bus, lid, fin, lug, conductor, structure, bracket, boss, attachment, or termination. In one embodiment, structure 1308 is made of a thermally conductive material. While only one structure 1308 is shown within system 1300, persons of ordinary skill in the art will recognize that any number of structures may be used. However, for simplicity, only one structure 1308 is shown within system 1300. In one embodiment, structure 1308 is mechanically coupled to non-heat generating component 1305. In another embodiment, structure 1308 is thermally coupled to heat dissipating component 1303. In yet another embodiment, structure 1308 is mechanically coupled to heat dissipating component 1303.

System 1300 allows heat to transfer from heat generating components 1301 to structure 1308 through heat dissipating component 1303 and non-heat generating component 1308. In some embodiments, structure 1308 is thermally grounded such that when heat is received by structure 1308, the heat dissipates. Because of the dielectric materials used for heat dissipating component 1303, load center 1306 can be thermally grounded without the undesirable grounding of heat generating components 1301.

Figure 14A:
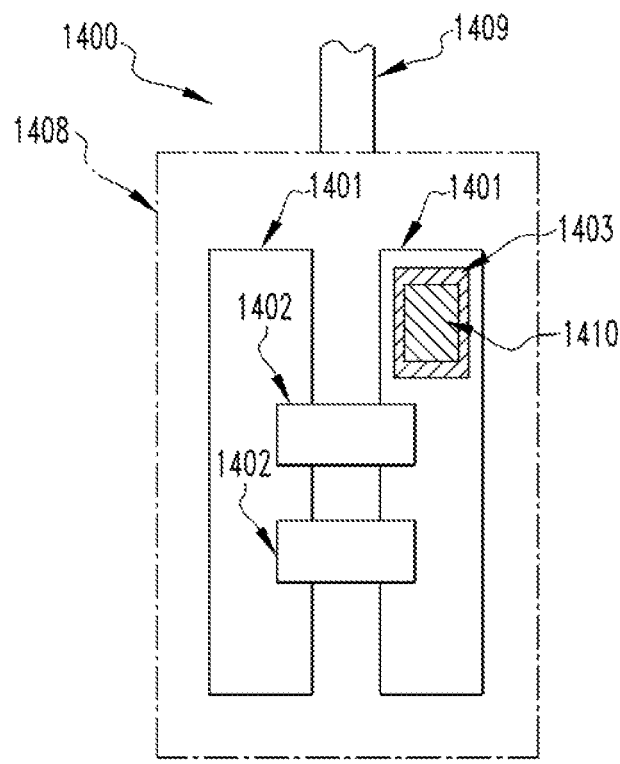
FIG. 14A is front view of a system for assisting in heat dissipation from a load center.

FIG. 14A is a front view of system 1400 for assisting in heat dissipation from a load center. System 1400 includes load center 1408, power source 1409 and structure 1410. Persons of ordinary skill in the art will recognize that system 1400 may include any number of structures and components, and one or more additional structures or components may be added or omitted without deviating from the scope of the present disclosure.

Figure 14B:
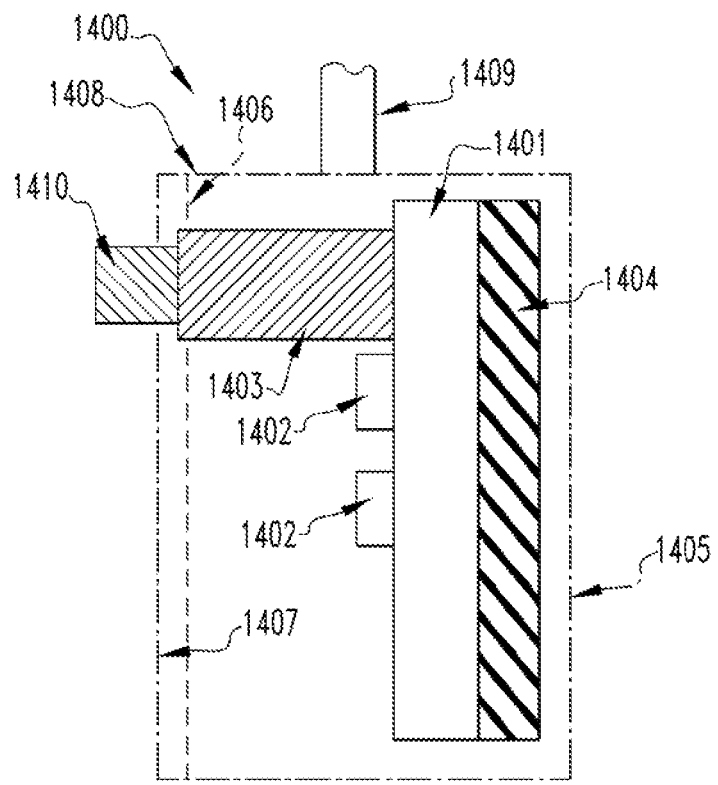
FIG. 14B is an illustrative schematic diagram of the system in FIG. 14A from the side perspective in accordance with an embodiment of the disclosed concept.

FIG. 14B is an illustrative schematic diagram of system 1400 in FIG. 14A from the side perspective in accordance with an embodiment of the disclosed concept. Load center 1408 is substantially similar to load center 1200 of FIG. 11C, however other load centers, such as load center 1100 of FIGS. 11A, 11B and 11C are also capable of being used within system 1400. Load center 1408, in the exemplary embodiment, includes heat generating components 1401, heat dissipating component 1403, and non-heat generating component 1406, which in one embodiment are substantially similar to heat generating component 1201, heat dissipating component 1203, and non-heat generating component 1206, respectively, of FIGS. 12A, 12B and 12C and the previous descriptions apply. Load center 1408 is structured such that heat is conducted from heat generating components 1401 and communicated from heat generating components 1401 to non-heat generating component 1406 via heat dissipating component 1403. In one embodiment, as shown in FIG. 14B, heat dissipating component 1403 protrudes through non-heat generating component 1406.

Power Source 1409 is substantially similar to power source 1307 of FIGS. 13A and 13B and the previous description applies. Power source 1409 corresponds to any device that is capable of providing electricity to a load center. In one embodiment, power source 1409 is electrically coupled to heat generating components 1401. In another embodiment, power source 1409 is mechanically coupled to heat generating components 1401.

Structure 1410, in a non-limiting, exemplary embodiment, is thermally coupled to non-heat generating component 1406. Structure 1410 is substantially similar to structure 1308 of FIG. 13B and the previous description applies. In one embodiment, structure 1410 is made of a thermally conductive material. While only one structure 1410 is shown within system 1400, persons of ordinary skill in the art will recognize that any number of structures may be used. However, for simplicity, only one structure 1410 is shown within system 1400. In one embodiment, structure 1410 is mechanically coupled to non-heat generating component 1406. In another embodiment, structure 1410 is thermally coupled to heat dissipating component 1403. In yet another embodiment, structure 1410 is mechanically coupled to heat dissipating component 1403.

System 1400 allows heat to transfer from heat generating components 1401 to structure 1410 through heat dissipating component 1403 and non-heat generating component 1406. In some embodiments, structure 1410 is thermally grounded such that when heat is received by structure 1410, the heat dissipates. Because of the dielectric materials used for heat dissipating component 1403, load center 1408 can be thermally grounded without undesirably electrically grounding heat generating components 1401.

In the claims, any reference signs placed between parentheses shall not be construed as limiting the claim. The word "comprising" or "including" does not exclude the presence of elements or steps other than those listed in a claim. In a device claim enumerating several means, several of these means may be embodied by one and the same item of hardware. The word "a" or "an" preceding an element does not exclude the presence of a plurality of such elements. In any device claim enumerating several means, several of these means may be embodied by one and the same item of hardware. The mere fact that certain elements are recited in mutually different dependent claims does not indicate that these elements cannot be used in combination.

Although the disclosed concept has been described in detail for the purpose of illustration based on what is currently considered to be the most practical and preferred embodiments, it is to be understood that such detail is solely for that purpose and that the disclosed concept is not limited to the disclosed embodiments, but, on the contrary, is intended to cover modifications and equivalent arrangements that are within the spirit and scope of the appended claims. For example, it is to be understood that the disclosed concept contemplates that, to the extent possible, one or more features of any embodiment can be combined with one or more features of any other embodiment.

What is claimed is:

1. A system comprising:
   an electrical device that generates heat;
   a secondary device; and
   a heat path device for assisting in heat dissipation, the heat path device comprising:
   a first structure formed of a first thermally conductive material, and including a first end and a second end, the first end of the first structure being thermally coupled to the electrical device;
   a second structure formed of a second thermally conductive material and including a first end and a second end, the first, end of the second structure being thermally coupled to the secondary device; and
   a third structure formed of a first dielectric material and including a first end and a second end, the first end of the third structure being mechanically coupled and thermally coupled to a second end of the first structure, the second end of the third structure being mechanically coupled and thermally coupled to a second end of the second structure, the third structure being spaced from the electrical device and the secondary device;
   a fourth structure formed of a second dielectric material and including a first end and a second end, wherein the first end of the fourth, structure is mechanically coupled and thermally coupled to a second end of the first structure, wherein the second end of the fourth structure is mechanically coupled and thermally coupled to a second end of the second structure, and a gap is defined between the third structure and the fourth structure;
   wherein the first structure and the second structure are located on a first plane, the third structure is located on a second plane, and the fourth structure is located in a third plane, such that the first end of the third structure overlaps the second end of the first structure and the second end of the third structure overlaps the second end of the second structure, and the first end of the fourth structure overlaps the second end of the first structure and the second end of the fourth structure overlaps the second end of the second structure.

2. The system recited in claim 1 further comprising a cover structured to provide thermal insulation for at least a portion of each of the third structure and the fourth structure.

3. The system of claim 2 wherein the cover is further structured such that the cover provides thermal insulation for at least a portion of the first structure and at least a portion of the second structure.

4. The system of claim 1 further comprising a cover structured to secure the third and the fourth structures to the first structure, to secure the third and the fourth structures to the second structure, and to thermally insulate at least a portion of each of the first structure, the second structure, the third structure, and the fourth structure.

5. The system of claim 1 wherein the first dielectric material comprises at least one of boron nitride and aluminum nitride and the second dielectric material comprises at least one of boron nitride and aluminum nitride.

6. Ile system of claim 1 wherein heat conducted by the first structure is communicated to the second structure via the third and the fourth structures, and wherein electrical current conducted by the first structure is attenuated by the third and the fourth structures.

* * * * *